United States Patent [19]
Ohsawa et al.

[11] Patent Number: 5,715,001
[45] Date of Patent: Feb. 3, 1998

[54] SOLID-STATE CAMERA DEVICE AND METHOD OF DRIVING THEREOF

[75] Inventors: Shinji Ohsawa, Ebina; Yoshiyuki Matsunaga, Kamakura, both of Japan

[73] Assignee: Kabushiki Kaisha Toshiba, Kawasaki, Japan

[21] Appl. No.: 422,160

[22] Filed: Apr. 14, 1995

[30] Foreign Application Priority Data

Apr. 18, 1994 [JP] Japan .................................. 6-078569

[51] Int. Cl.$^6$ ..................................................... H04N 3/14
[52] U.S. Cl. ........................... 348/313; 348/317; 257/214
[58] Field of Search ................................... 348/313, 312, 348/314, 316, 317, 324; 257/229, 230, 232, 226, 242, 237, 214, 216

[56] References Cited

U.S. PATENT DOCUMENTS

| | | | |
|---|---|---|---|
| 4,684,993 | 8/1987 | Berger et al. | 348/324 |
| 4,912,560 | 3/1990 | Osawa et al. | 348/313 |
| 5,504,526 | 4/1996 | Miyagawa et al. | 348/313 |

FOREIGN PATENT DOCUMENTS 61-70871  4/1986  Japan .

*Primary Examiner*—Andrew Faile
*Assistant Examiner*—Andrew B. Christensen
*Attorney, Agent, or Firm*—Oblon, Spivak, McClelland, Maier & Neustadt, P.C.

[57] ABSTRACT

A solid-state camera device of the present invention includes a semiconductor substrate, a plurality of charge storage regions formed on the semiconductor substrate, a charge transfer region formed on the semiconductor substrate, for transferring charges read from the plurality of charge storage regions, a bias charge injection diode formed on the semiconductor substrate, for injecting a bias charge into the charge storage region, and sweeping out section for sweeping at least part of the charge remaining in the charge transfer region before resetting part of the bias charge injected into the charge storage region to emit part of the bias charge into the charge transfer region. That is, the present invention has a feature that the residual charge lying in the charge transfer region below the transfer gate specified for reading is swept before resetting the bias charge after injecting the bias charge into the charge storage region.

16 Claims, 9 Drawing Sheets

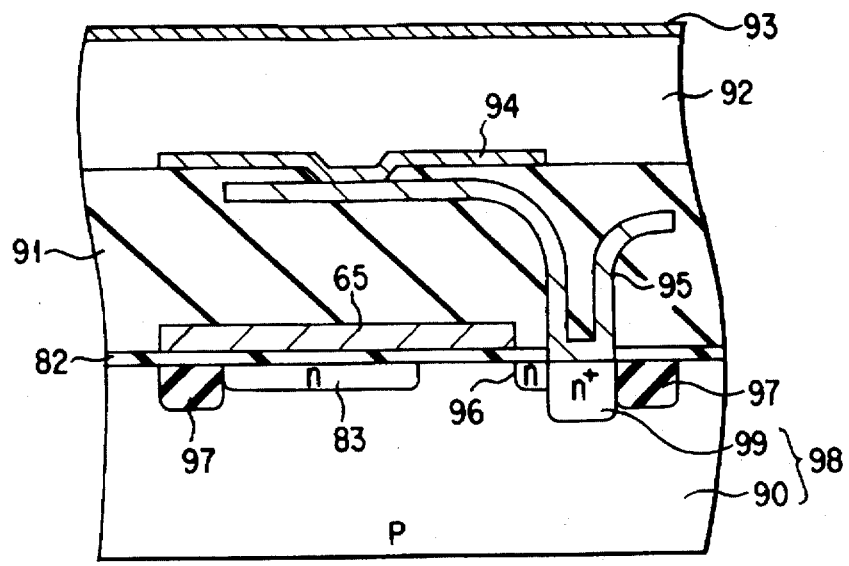
F I G. 3
(PRIOR ART)
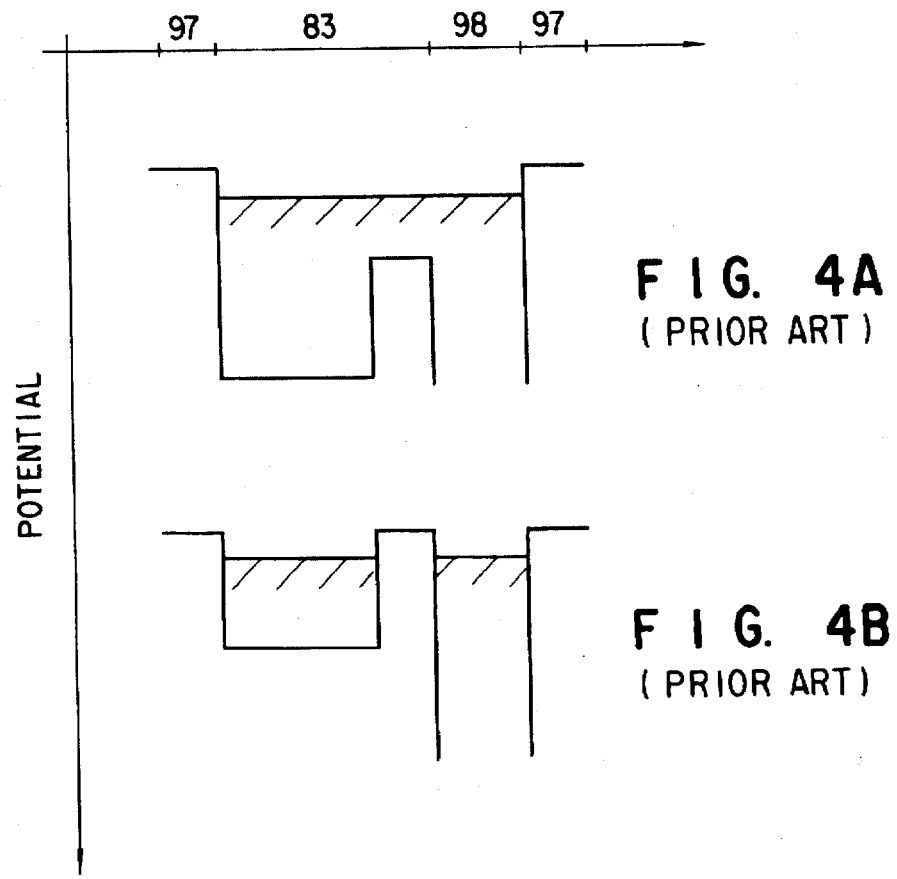
F I G. 4A
(PRIOR ART)
F I G. 4B
(PRIOR ART)

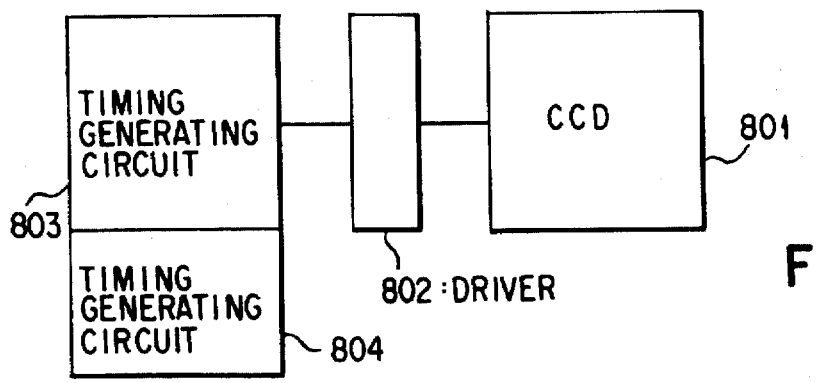
F I G. 8
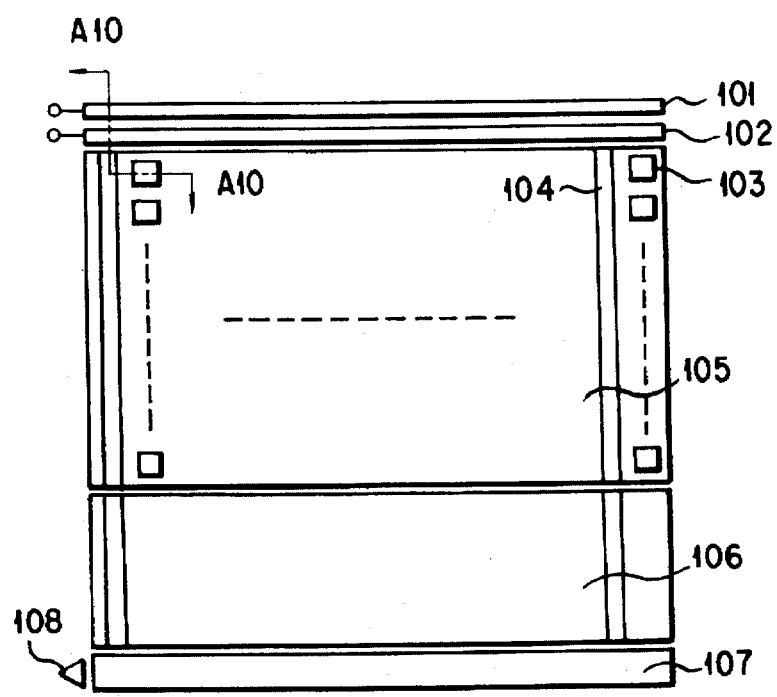
F I G. 9

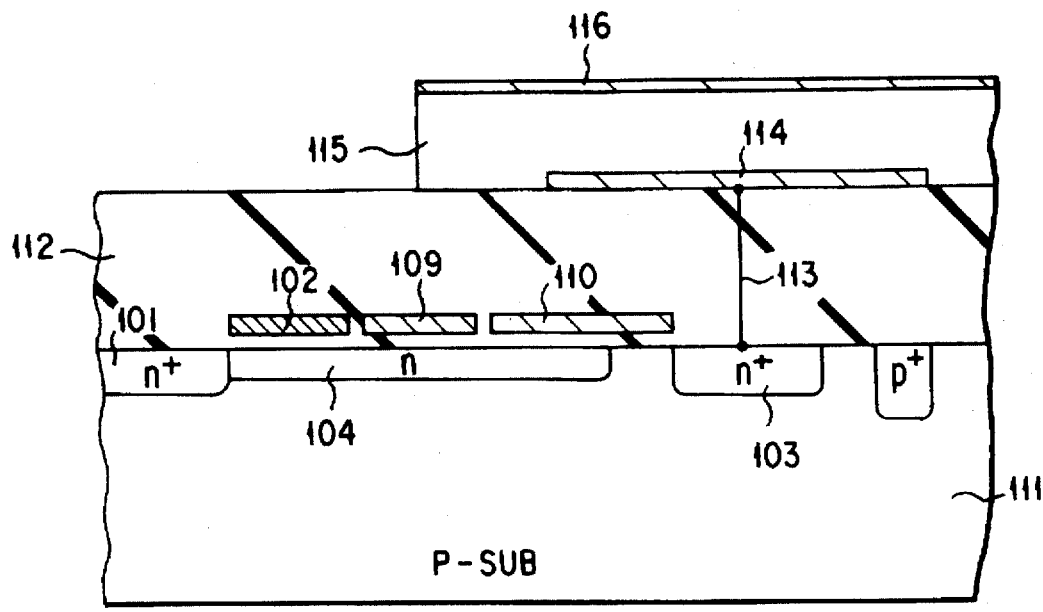
F I G. 10
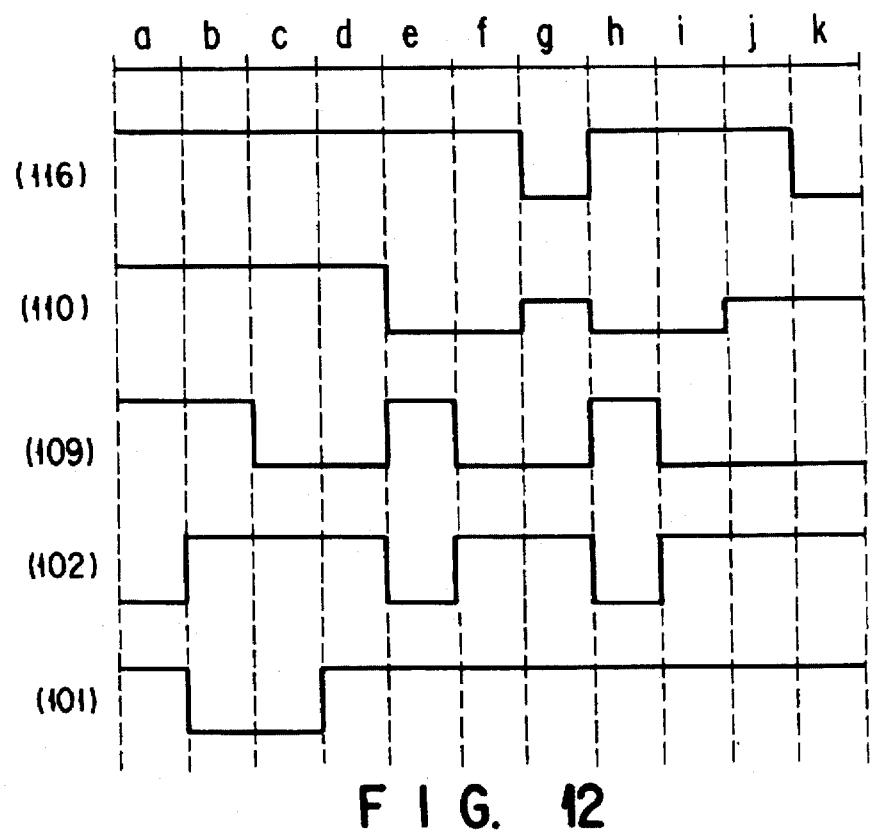
F I G. 12

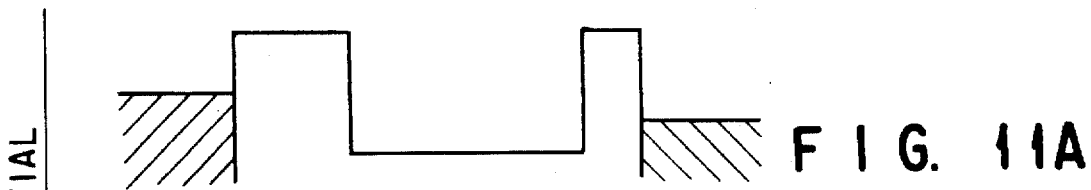
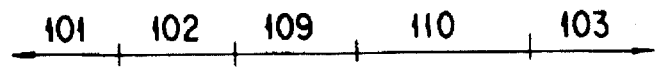
FIG. 11A
FIG. 11B
FIG. 11C
FIG. 11D
FIG. 11E

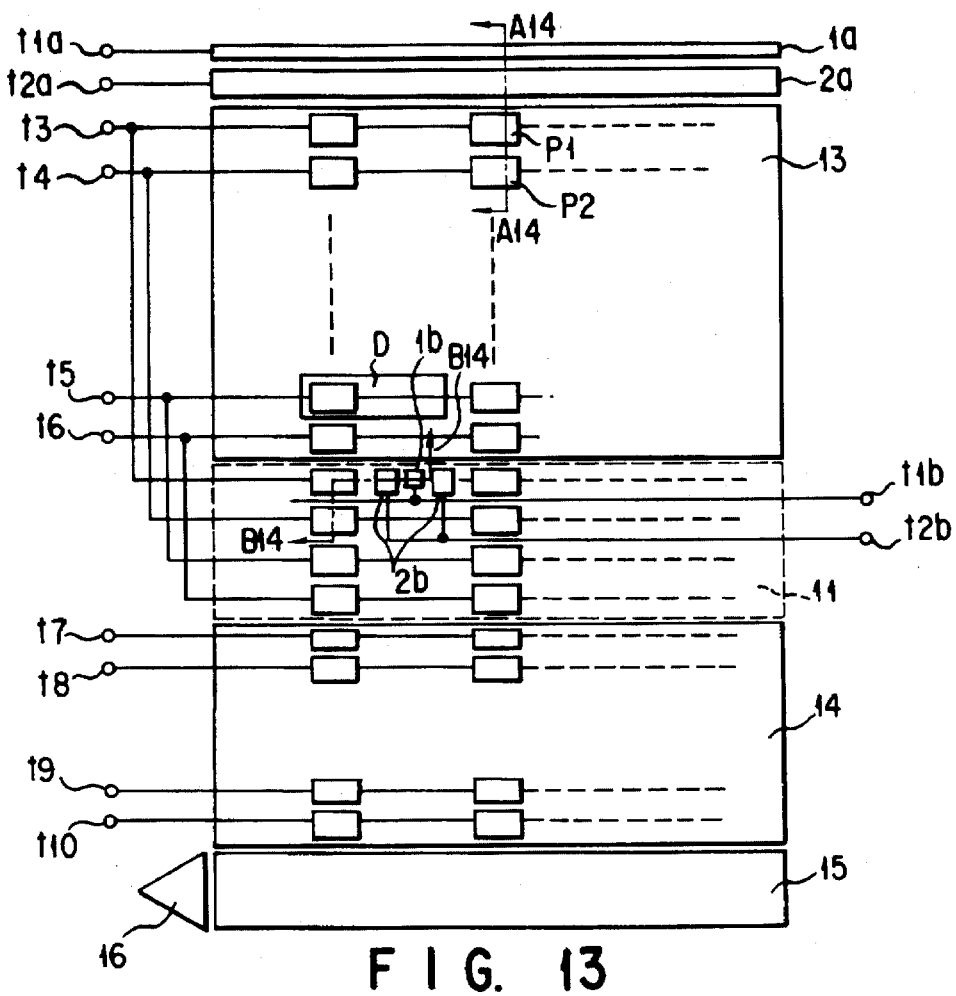
F I G. 13
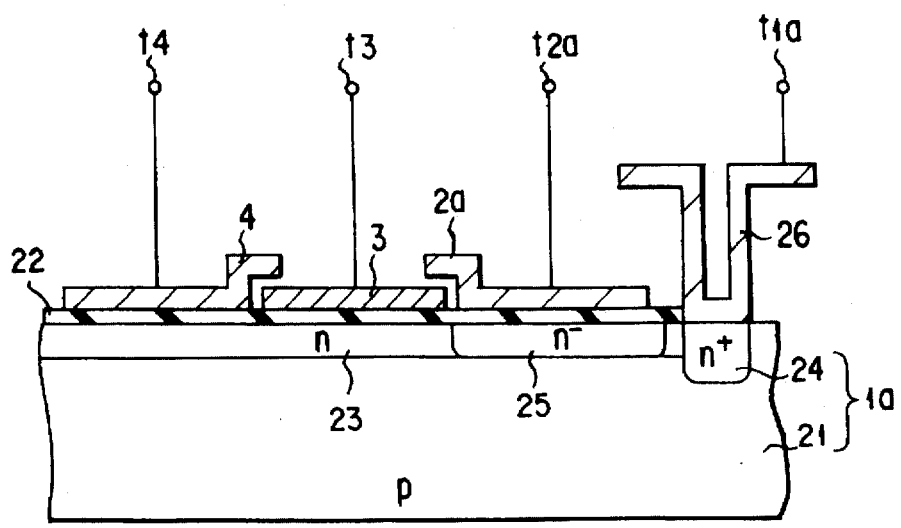
F I G. 14

SOLID-STATE CAMERA DEVICE AND METHOD OF DRIVING THEREOF

BACKGROUND OF THE INVENTION

1. Field of the Invention

The present invention relates to a solid-state camera device, which is used for such as TV camera and is particularly used to inject/emit a bias charge to/from a charge storage section, and a method of driving thereof.

2. Description of the Related Art

Recently, as a camera device for home video movie or broadcasting camera, a solid-state camera device having a charge coupled device (CCD) in the signal scanning section is widely used. With the recent development of IC manufacturing technique, the performance of high precision and low noise thereof is further enhanced. Recently, a solid-state camera device of two-storied structure having a photo conversion layer formed on a light receiving area is developed. The solid-state camera device of two-storied structure of photo conversion layer overbid has an excellent feature that high sensitivity can be maintained in a minute pixel and is most expected to be used as a camera device for the camera of a high definition television or the like.

FIG. 1 is a schematic view showing the schematic structure of a solid-state camera device using a charge coupled device.

An incident light is subjected to the photoelectric conversion in a photoelectric converter (not shown) in a light receiving area and converted into a signal charge and the signal charge is transferred to a storage region 75 via transfer electrodes connected to transfer electrode terminals t63 to t66 for transferring charges in the vertical direction by applying transfer pulses to the transfer electrode terminals and temporarily stored in the storage region.

The signal charge temporarily stored in the storage region 75 is transferred to a horizontal CCD 76 by applying transfer pulses to transfer electrode terminals t69 to t72 and sequentially output as a signal suitable for TV format from an on-chip amplifier 77.

FIG. 2 is a cross sectional view taken along the line A2—A2 of charge transfer regions P1 and P2 of the solid-state camera device of FIG. 1.

An n-type impurity region used as a charge transfer channel 83 is formed on the surface of a p-type semiconductor substrate 81 and an n-type impurity region 84 of high impurity concentration which constructs a bias charge injection/sweep-out diode 61 is formed adjacent to the charge transfer channel 83 on the surface of the substrate 81. A transfer electrode 63, transfer electrode 64 and bias charge injection/sweep-out gate electrode 62 are formed over the charge transfer channel 83 with an oxide film 82 disposed therebetween. A wiring 85 is formed on the n-type impurity region 84 of high impurity concentration.

FIG. 3 is a cross sectional view showing one pixel (one cell) in an area D of the solid-state camera device of FIG. 1.

Light incident on the pixel via a transparent electrode 93 is converted into a signal charge by a photoelectric conversion layer 92 and the signal charge is transferred via a pixel electrode 94 and pixel electrode 95 and stored in a storage diode 98 formed in a p-type semiconductor substrate 90.

The signal charge stored in the storage diode 98 is transferred to the charge transfer channel 83 via an n-type impurity region 96 and an n-type channel formed in the substrate surface which lies below the transfer gate electrode 65. The impurity region 96 and impurity region 99 are isolated from other pixels by an element separating insulation layer 97 and the oxide film 82 and an insulation layer 91 are formed on the substrate 90.

In order to lower the contact resistance between the pixel electrode 95 and the storage diode 98, the n-type impurity region 99 constructing the storage diode 98 is generally formed to have high impurity concentration.

If the n-type impurity region 99 is formed with high impurity concentration, it becomes difficult to completely transfer the signal charge. Therefore, in order to prevent the signal charge from being left behind, a bias charge is injected. However, since it is difficult to uniformly inject a preset amount of bias charge in one cycle of injection, a method of uniformly injecting the bias charge by first injecting the bias charge of an amount larger than the preset amount and emitting the extra bias charge is used.

The bias charge injection/sweep-out of the bias charge is effected as follows.

Injection of the bias charge is effected by applying a positive voltage to the transfer gate electrode 65 to lower the barrier between the charge transfer channel 83 and the storage diode 98 as shown in FIG. 4A and permit the bias charge in the charge transfer channel 83 to flow into the storage diode 98.

Sweep out of the bias charge is effected by applying a negative voltage to the transfer gate electrode 65 to raise the barrier between the charge transfer channel 83 and the storage diode 98 as shown in FIG. 4A so as to isolate the charge transfer channel 83 from the storage diode 98 and permit the bias charge in the charge transfer channel 83 to flow into the bias charge injection/sweep-out diode 61.

However, in the conventional solid-state camera device, since the bias charge injection/sweep-out diode 61 is formed only in the upper end portion of the light receiving area 73, it takes a long time to inject the bias charge into the lower end portion of the light receiving area 73 or emit the bias charge from the lower end portion of the light receiving area 73.

The solid-state camera device of two-storied structure of photo conversion layer overbid has a problem that a capacitive after-image which deteriorates the characteristic of the element occurs. The capacitive after-image occurs because the signal charge cannot be completely read when the signal charge stored in the pixel is read into the signal scanning section and it particularly deteriorates an image of low illuminance. In order to eliminate the capacitive after-image, the following driving method is generally used.

In the following explanation, since the basic structure of the solid-state camera device is the same as that of FIG. 1, the structure thereof is not shown in the drawing and the bias injection/sweep-out operation of the bias charge is explained with reference to FIGS. 5A to 5I. FIGS. 5A to 5I show the potentials of a bias charge injection diode 101, gate 102, charge storage region 103, and transfer gates 109 and 110. The hatched portion in FIGS. 5A to 5I indicates the presence of signal charge.

First, the signal charge is passed through a portion below the transfer gates 109, 110 and injected into the charge storage region 103 by opening the gate 102 from the state of FIG. 5A to the state of FIG. 5B. As shown in FIGS. 5C to 5E, resetting of the bias charge is effected by raising the potential of the diode 101 after the transfer gate 109 is closed and then lowering the potential of the transparent electrode 116 of FIG. 1 and part of the bias charge is swept out from the charge storage region 103 to a portion below the transfer gate 110. At this time, a residual charge 201 is left behind in the portion below the transfer gate 110.

A swept out bias charge 202 passes a portion below the transfer gates 109, 110 and gate 102 together with the residual charge 201 as shown in FIGS. 5F and 5G, and swept out into the diode 101. After this, as shown in FIGS. 5H and 5I, a signal charge 203 is stored in the charge storage region 103 and is read into a portion below the transfer gate 110 together with a bias charge 204 left behind in the charge storage region 103.

The readout charge is sequentially transferred and output from a signal charge detector (not shown). FIG. 6 shows the timings of pulses supplied to the gate in the states shown in FIGS. 5A to 5L.

However, this type of method has the following problem.

In the bias charge injection/sweep-out operation of the bias charge, the residual charge 201 is present in the portion below the transfer gate 110 at the time of resetting of the bias charge 202 (FIG. 5E), but no residual charge is present in the portion below the transfer gate 110 at the time of reading of the signal charge 203 and bias charge 204 (FIG. 5I). The amount of charge read from the charge storage region 103 becomes different depending on whether or not the residual charge is present in the portion below the transfer gate 110 when the charge is read from the charge storage region 103. Since the difference in the charge amount is different for each of the charge storage regions arranged in a matrix form, the difference appears on the image plane as fixed pattern noise.

More specifically, a variation in the amount of charge read from each of the charge storage regions will occur due to a variation in the transistor characteristics of the readout gate or the like. If a variation caused at the resetting time is the same as a variation caused at the signal reading time in each of the charge storage regions, no fixed pattern noise occurs.

However, since the residual charge is left behind in the charge transfer region at the resetting time, the charge reading operation cannot be smoothly effected and is significantly influenced by a variation in the transistor characteristics of the readout gate. On the other hand, since no residual charge is present in the charge transfer gate at the signal reading time, the charge reading operation can be smoothly effected and is less influenced by a variation in the transistor characteristics of the readout gate. Thus, the influence by a variation in the transistor characteristics of the readout gate becomes significantly different at the resetting time and at the signal reading time, thereby causing the fixed pattern noise.

As described above, in the conventional driving method for the solid-state camera device, since the amount of readout charge becomes different at the bias charge resetting time and at the signal reading time and the difference in the readout charge amount is different for each pixel, the fixed pattern noise will occur. That is, if the bias charge injection/sweep-out operation for the bias charge is effected to suppress the capacitive after-image, the fixed pattern noise occurs.

SUMMARY OF THE INVENTION

An object of the present invention is to provide a solid-state camera device capable of suppressing the fixed pattern noise caused by a variation in the difference of readout charge amount to suppress occurrence of a capacitive after-image and suppress the fixed pattern noise and a method of driving the same.

The main point of the present invention is that the operation of sweeping out the residual charge lying below the transfer gate specified for reading is effected before resetting of the bias charge.

A solid-state camera device of the present invention comprises a semiconductor substrate; a plurality of charge storage regions formed on the semiconductor substrate; a charge transfer region formed on the semiconductor substrate, for transferring a charge read from the plurality of charge storage regions; a bias charge injection diode formed on the semiconductor substrate, for injecting a bias charge into the charge storage region; and sweeping out means for sweeping at least part of the charge remaining in the charge transfer region before resetting part of the bias charge injected into the charge storage region to emit part of the bias charge into the charge transfer region.

The preferable embodiments of the present invention are as follows:

(1) The plurality of charge storage regions are arranged in a matrix form.

(2) The charge transfer region has a plurality of charge transfer regions arranged along the plurality of charge storage regions.

(3) The charge transfer region has a plurality of charge transfer regions arranged along the plurality of charge storage regions and includes a vertical charge transfer region for transferring a charge read from the charge storage region in a vertical direction and a horizontal charge transfer region for transferring the charge from the vertical transfer section in a horizontal direction, and the solid-state camera device further comprises a signal charge detector for reading the charge transferred by the horizontal charge transfer region.

(4) The sweep means includes means for repeatedly effecting the operation of sweeping out the residual charge in the charge transfer region and the succeeding operation of resetting the bias charge in the charge storage region.

(5) The solid-state camera device further comprises a photo conversion layer stacked on a light receiving area on which the charge storage region and charge transfer region are arranged.

(6) The solid-state camera device is of FIT type having a signal temporarily storing section disposed adjacent to the light receiving section.

(7) In the above case, the solid-state camera device further comprises a light receiving area formed on the semiconductor substrate and having a plurality of photo-electric conversion sections for photo-electrically converting incident light, a storage region for temporarily storing the charge transferred from the charge transfer region, first bias charge injection/sweep-out means disposed adjacent to the light receiving area and in an area on the opposite side with respect to the storage region, and second bias charge injection/sweep-out means disposed in an area between the light receiving area and the storage region. In this case, each of the first and second bias charge injection/sweep-out means includes a bias charge injection/sweep-out diode and a bias charge injection/sweep-out gate, the gate electrodes of the charge transfer region adjacent to the bias charge injection/sweep-out gates being connected to each other.

A solid-state camera device driving method of the present invention comprises a first step of injecting a bias charge from a bias charge injection diode to a charge storage region via a charge transfer region; a second step of sweeping at least part of the charge remaining in the charge transfer region; a third step of resetting part of the injected bias charge and emitting the same into the charge transfer region; and a fourth step of charging a signal in the charge storage region for a preset period of time and reading the stored signal charge together with the bias charge. Further, the solid-state camera device driving method further comprises a step of repeatedly effecting the second step and third step by plural times.

According to the present invention, the amounts of charge remaining in the charge transfer region at the bias charge resetting time and at the signal reading time can be made as close to each other as possible by sweeping out the residual charge left in the charge transfer region below the transfer gate specified for reading after injecting the bias charge into the charge storage region and before resetting the same. Therefore, a difference between the amounts of readout charge at the bias charge resetting time and at the signal reading time can be made small and the fixed pattern noise can be suppressed. This is particularly effective in a device such as a photo conversion layer overbid solid-state camera device which requires the bias charge injection/sweep-out of the bias charge to suppress occurrence of the capacitive after-image.

As described above, according to the present invention, the fixed pattern noise occurring at the time of bias charge injection/sweep-out of the bias charge can be suppressed by effecting the operation of sweeping out the residual charge left below the transfer gate specified for reading before resetting the bias charge which is injected after the bias charge is injected into the charge storage region.

Further, in the present invention, two bias charge injection/sweep-out means are provided in the light receiving area. Therefore, if the bias charge injection/sweep-out of the bias charge of the storage diode in the light receiving area is effected by one of the two bias charge injection/sweep-out means which is closer to the storage diode, for example, the bias charge injection/sweep-out of the bias charge can be effected at higher speed in comparison with the conventional solid-state camera device having only one bias charge injection/sweep-out means.

As described above, according to the present invention, since two bias charge injection/sweep-out means are provided, the bias charge injection/sweep-out of the bias charge can be effectively effected and time for the bias charge injection/sweep-out of the bias charge can be shortened.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIG. 3 is a cross sectional view showing the cell structure in the solid-state camera device of FIG. 1;

FIGS. 4A and 4B are diagrams for illustrating the bias charge injection/sweep-out of the bias charge;

FIG. 8 is a schematic diagram of a CCD driving circuit of a solid-state camera device of the present invention;

FIG. 9 is a plan view showing the basic construction of a solid-state camera device used in one embodiment of the present invention;

FIG. 10 is a cross sectional view showing the basic structure of a solid-state camera device used in one embodiment of the present invention;

FIGS. 11A to 11K are diagrammatical views for illustrating the method of driving the solid-state camera device according to the embodiment;

FIG. 12 is a driving timing diagram of the solid-state camera device of the embodiment;

FIG. 13 is a schematic view showing the schematic structure of a solid-state camera device according to another embodiment of the present invention; and FIG. 14 is a cross sectional view taken along the line A14—A14 of the solid-state camera device of FIG. 13.

DETAILED DESCRIPTION OF THE PREFERRED EMBODIMENTS

There will now be described embodiments of the present invention with reference to the accompanying drawings.

Figure 7:
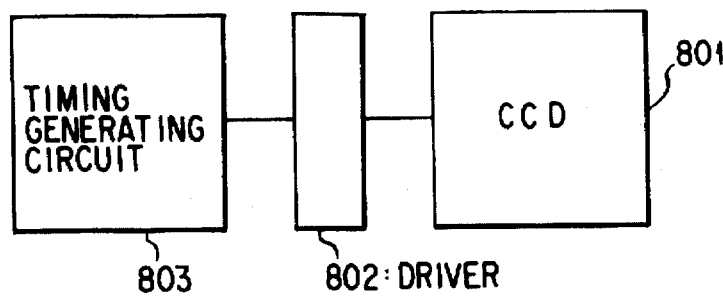
FIG. 7 is a schematic diagram of a CCD driving circuit of the conventional solid-state camera device.

FIG. 7 is a schematic diagram of a CCD driving circuit of the conventional solid-state camera device. Conventionally, a CCD 801 is directly driven by a drive circuit 802. A timing generation circuit 803 applies a pulse wave to the drive circuit 802.

FIG. 8 is a schematic diagram showing a CCD driving circuit of a solid-state camera device of the present invention. In the present invention, a CCD 801 is also directly driven by a drive circuit 802, but the drive circuit 802 is applied with a pulse wave from a second timing generation circuit 804 in addition to the conventional first timing generation circuit 803. The timing of the sweeping operation effected before resetting of the bias charge is controlled by the second timing generation circuit 804.

FIG. 9 is a plan view showing the basic structure of a solid-state camera device used in one embodiment of the present invention and the device structure thereof is of frame interline transfer (FIT) type having a signal temporarily storing section disposed adjacent to the light receiving area.

The solid-state camera device of FIG. 9 includes a bias charge injection diode 101, gate 102, charge storage region 103, vertical CCD (vertical charge transfer region) 104, cell region (light receiving area) 105, storage region 106, horizontal CCD (horizontal charge transfer region) 107 and signal charge detector 108.

In the solid-state camera device with the above structure, the bias charge is injected from the diode 101 into the vertical CCD 104 by opening the gate 102 and then injected into charge storage regions 103 arranged in a matrix form. The bias charge injected into the charge storage region 103 is read at the same time as the signal charge, but it is reset before storage of the signal so as to derive a constant amount of charge from each pixel at the reading time. The reset bias charge is swept out into the vertical CCD 104, transferred in a direction opposite to the charge transferring direction at the injection time, passed through the gate 102, and swept out to the diode 101. Thus, the after-image can be suppressed by resetting the potential of the charge storage region 103 in each cycle by effecting the bias charge injection/sweep-out operation for the bias charge.

The signal charge is stored into the charge storage region 103 after sweep out of the bias charge, read into the vertical CCD 104 at a constant timing, transferred from the cell region 105 to the storage region 106 and then to the horizontal CCD 107, and output from the signal charge detector 108.

The cross section of the solid-state camera device taken along the line A10—A10 of FIG. 9 is shown in FIG. 10. The bias charge injection diode 101, vertical CCD 104 and charge storage regions 103 are formed on a p-type semiconductor substrate 111, and the bias charge is transferred from the diode 101 to a portion below the gate 102, passed through the charge transfer region below the transfer gates 109 and 110 and then injected into the charge storage region 103. A photo conversion layer 115 is formed over the charge storage regions 103 with an insulation layer 112 disposed therebetween and a transparent electrode 116 is formed on the photo conversion layer 115. Light is photoelectrically converted into a charge in the photo conversion layer 115, transferred via a pixel electrode 114 and lead-out electrode 113 and stored into the charge storage region 103.

An example of the method of driving the solid-state camera device according to one embodiment of the present invention is shown in FIGS. 11A to 11K.

First, the signal charge is passed through a portion below the transfer gates 109 and 110, and injected into the charge storage region 103 by opening the gate 102 from the state of FIG. 11A to the state of FIG. 11B. As shown in FIGS. 11C and 11D, resetting of the bias charge is effected by raising the potential of the diode 101 after the transfer gate 109 is closed.

Figure 11F:
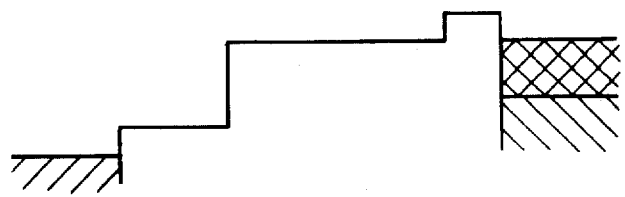

The present invention is different from the prior art in that the residual charge left in a portion below the gate 110 is transferred and swept to the diode 101 before part of the bias charge is reset and swept out as shown in FIGS. 11E to 11F.

Figure 11G:
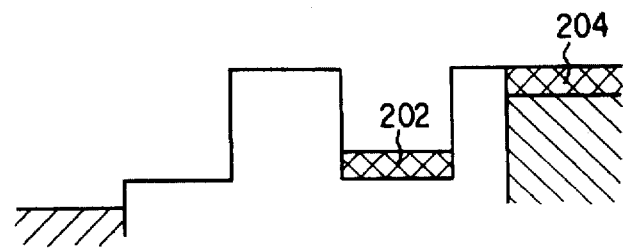
Figure 11H:
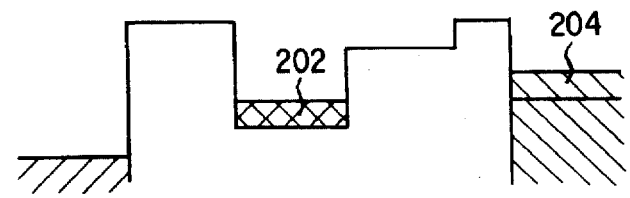
Figure 11I:
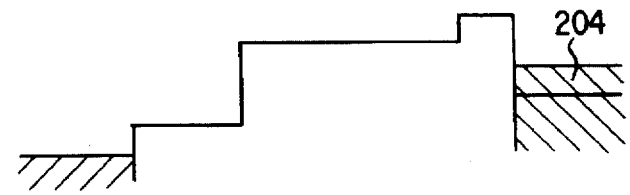

After this, as shown in FIGS. 11G to 11I, part 202 of the bias charge in the charge storage region 103 is reset and swept out to the portion below the gate 110, then transferred in the same manner as in the case of the residual charge 201, and swept to the diode 101.

Figure 11J:
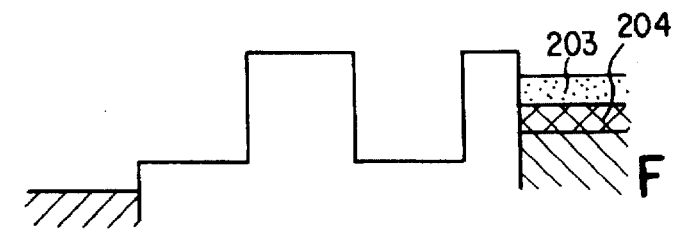
Figure 11K:
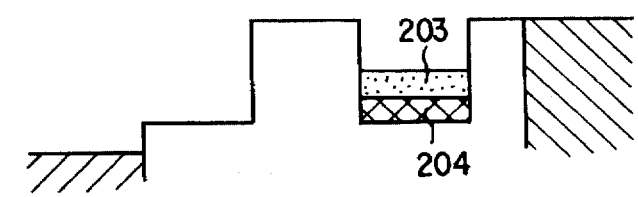

Next, as shown in FIGS. 11J, 11K, the signal storage period is started and a signal charge 203 stored in the charge storage region 103 is read into a portion below the transfer gate 110 together with the bias charge 204 left behind in the charge storage region 103. Then, the readout charge is sequentially transferred in the vertical CCD 104.

In this embodiment, since no residual charge is left in the vertical CCD 104 below the gate 110 specified for reading at the bias charge resetting time (FIG. 11G) and at the signal charge reading time (FIG. 11K), no difference occurs in the amount of charge read from the charge storage region 103. Therefore, a variation in the amount of readout charge in each of the pixels can be prevented and the fixed pattern noise can be suppressed. A reset bias charge may be swept out immediately before reading out a signal. The rough timings of driving pulses used in the operations shown in FIGS. 11A to 11K are shown in FIG. 12.

The above explanation is made with attention given to one pixel in the area sensor, but, in practice, the bias charge injection/sweep-out operation is effected in the same manner for all of the charge storage regions 103 arranged in a matrix form as shown in FIGS. 9 and 10. Since the charge left in the charge transfer region can be more stably swept by repeatedly effecting the operation of resetting and sweeping out the bias charge, the effect of suppression of the fixed pattern noise can be further increased.

As described above, according to the present invention, since the amounts of the residual charge lying in the portion below the transfer gate 110 specified for reading at the bias charge resetting time and at the signal charge reading time can be substantially set to "0" by effecting the operation of sweeping out the residual charge 201 left in the portion below the transfer gate 110 specified for reading before resetting the bias charge after injecting the bias charge into the charge storage region 103, no difference occurs in the amount of charge read from the charge storage region 103. Therefore, the fixed pattern noise caused by a variation in the difference in the amount of readout charge can be suppressed, and occurrence of the after-image can be suppressed and the fixed pattern noise can be reduced. The present invention has an advantage that it is only required to change the driving pulse and it is possible to use the device structure which is substantially the same as the conventional device structure, and the invention can be easily realized.

The present invention is not limited to the above embodiment.

In the above embodiment, the photo conversion layer overbid having the photo conversion layer formed on the light receiving area is explained, but the present invention is not limited to this structure and can be applied to a solid-state camera device of plane type having no stacked photo conversion layer. The present invention is not limited to the 2-dimensional area sensor but can be applied to a linear sensor. Further, the present invention is not limited to the FIT type having the signal charge temporarily storing section, but can be applied to a frame inter-line (IT) type.

An example of the solid-state camera device to which the present invention can be applied is explained below.

FIG. 13 is a schematic view showing the schematic structure of a solid-state camera device according to another embodiment of the present invention.

Figure 1:
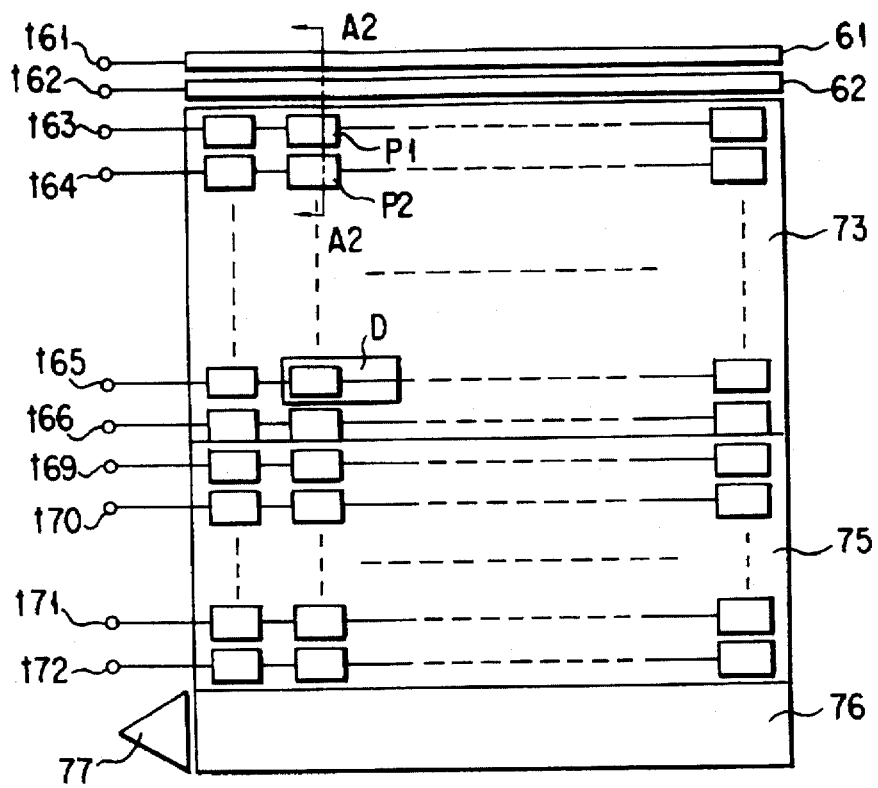
FIG. 1 is a schematic view showing the structure of a conventional solid-state camera device.
Figure 2:
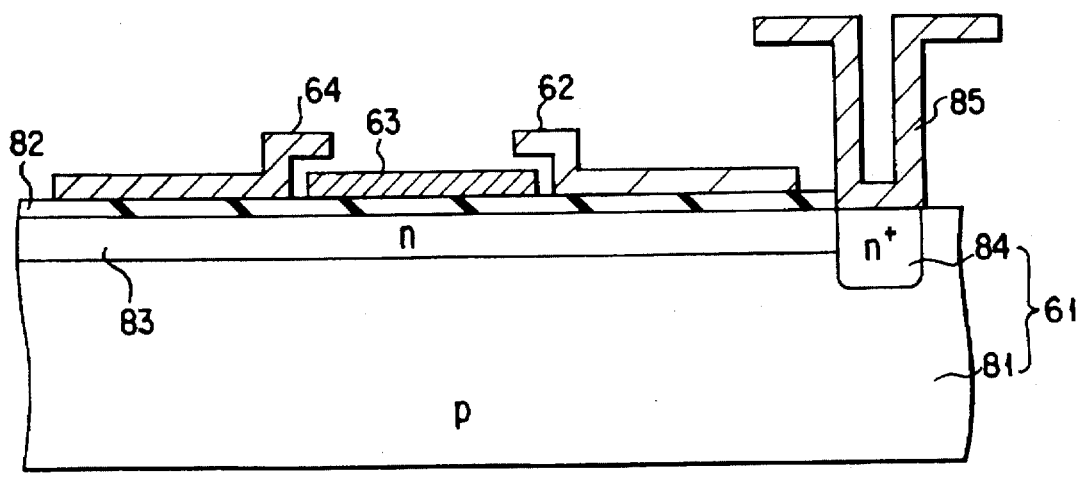
FIG. 2 is a cross sectional view taken along the line A2—A2 of the solid-state camera device of FIG. 1.
Figure 5A:
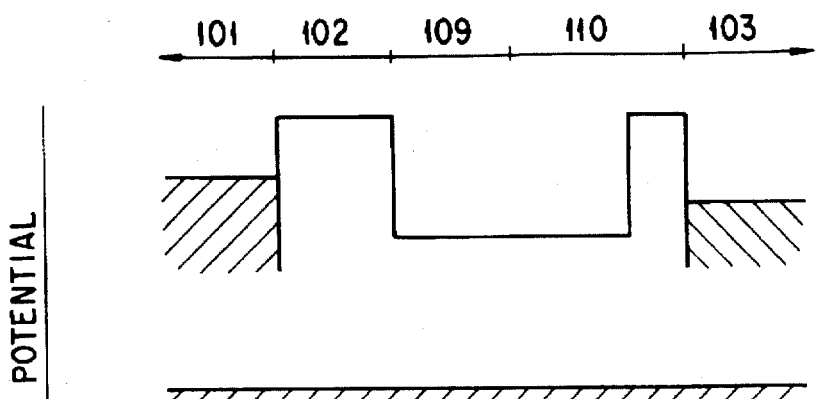
FIGS. 5A to 5I are diagrammatical views for illustrating the method of driving the conventional solid-state camera device.
Figure 5B:
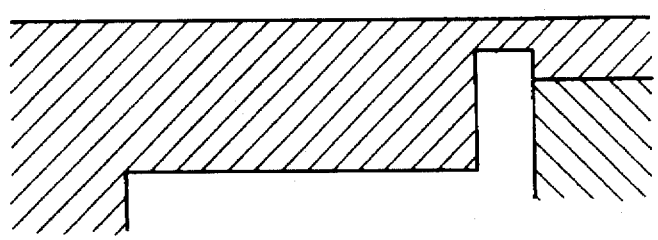
Figure 5C:
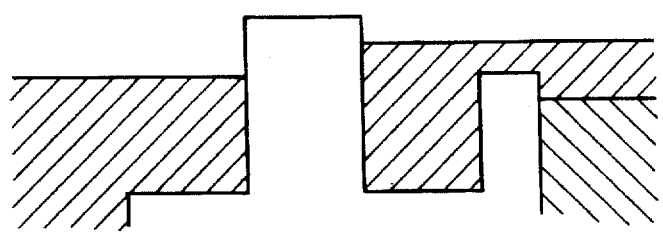
Figure 5D:
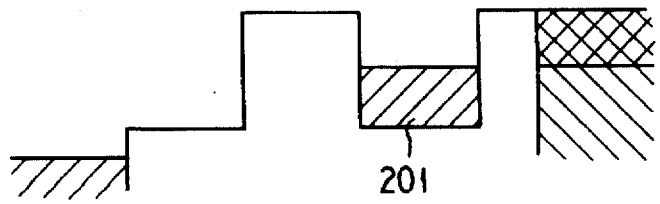
Figure 5E:
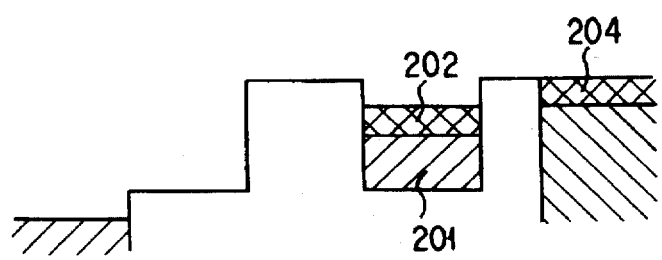
Figure 5F:
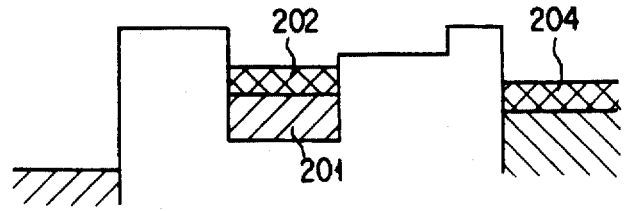
Figure 5G:
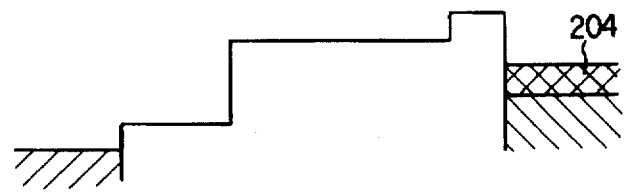
Figure 5H:
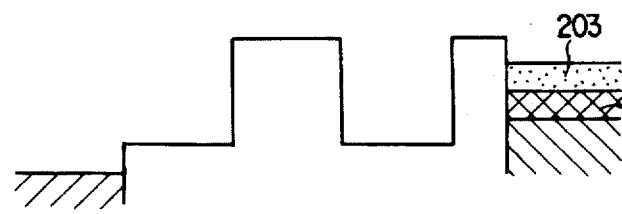
Figure 5I:
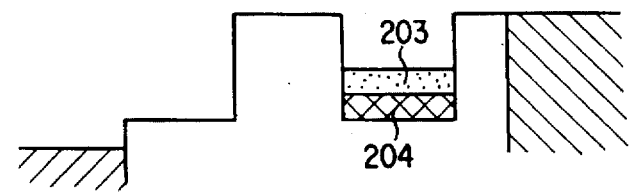
Figure 6:
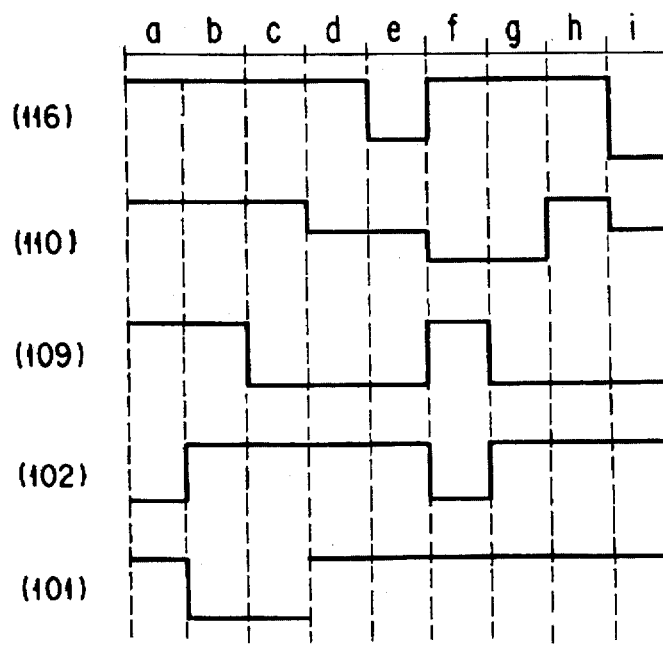
FIG. 6 is a driving timing diagram of the conventional solid-state camera device.

The main difference between the solid-state camera device of this embodiment and the solid-state camera device of FIG. 1 is that the bias charge injection/sweep-out of the bias charge is effected by two bias charge injection/sweep-out means.

As shown in FIG. 13, pixels are arranged in a matrix form in a light receiving area 13 (first light receiving area) and a photoelectric conversion section (not shown) for photoelectrically converting incident light to create a signal charge is formed in each of the pixel areas. The signal charge is transferred to a storage region 14 via transfer electrodes and temporarily stored therein by applying transfer pulses to transfer electrode terminals t3 to t6 for transferring the charge in the vertical direction by use of a vertical CCD (first signal charge transfer means).

The signal charge temporarily stored in the storage region 14 is transferred to a horizontal CCD (second signal charge transfer means) 15 by applying transfer pulses to transfer electrode terminals t7 to t10, and the signal charge is transferred in the horizontal direction by the horizontal CCD 15 and sequentially output as a signal suitable for TV format from an on-chip amplifier 16.

FIG. 14 is a cross sectional view taken along the line A14—A14 of charge transfer regions P1 and P2 of the solid-state camera device of FIG. 13.

An n-type impurity region used as a charge transfer channel 23 is formed on the surface of a p-type semiconductor substrate 21 and an n-type impurity region 24 of high impurity concentration which constructs a bias charge injection/sweep-out diode 1a is formed on the surface of the substrate 21. A wiring 26 is formed on the n-type impurity region 24. A transfer electrode 3, transfer electrode 4 and bias charge injection/sweep-out gate electrode 2a are formed over the charge transfer channel 23 with an oxide film 22 disposed therebetween. The bias charge injection/sweep-out diode 1a and bias charge injection/sweep-out gate electrode 2a construct first bias charge injection/sweep-out means.

Further, in order to control the potential of a channel formed below the bias charge injection/sweep-out gate electrode 2a, that portion of the n-type impurity region 24 which lies below the bias charge injection/sweep-out gate electrode 2a is formed as an n-type impurity region 25 of low impurity concentration.

A coupling area 11 is formed between the light receiving area 13 and the storage region 14 and a bias charge injection/sweep-out diode 1b and a bias charge injection/sweep-out gate electrode 2b which construct second bias charge injection/sweep-out means are formed in the coupling area 11. The cross section taken along the line B14—B14 of FIG. 13 is the same as the cross section taken along the line A14—A14 of FIG. 14. That is, bias charge injection/sweep-out means having the same structure as the light receiving area 13 is formed in the coupling area 11.

The structure of one pixel (one cell) in an area D of FIG. 13 includes a photo conversion layer and a storage diode like the pixel of FIG. 3. That is, a transparent electrode is formed on the semiconductor substrate, and light incident on the pixel via the transparent electrode is converted into a signal charge by the photo conversion layer and the signal charge is transferred via two laminated pixel electrodes and stored in the storage diode formed in the semiconductor substrate.

The gate electrodes of signal charge transfer means formed adjacent to the first and second bias charge injection/sweep-out means are connected by the same wiring.

According to the solid-state camera device of this embodiment, the following effect can be attained in addition to the effect of the former embodiment.

Since the first and second bias charge injection/sweep-out means are provided, the storage diode becomes closer to one of the two bias charge injection/sweep-out means even when it is set far from the other bias charge injection/sweep-out means, and therefore, the bias charge injection/sweep-out of the bias charge can be effected more rapidly than in the conventional case by simultaneously effecting the bias charge injection/sweep-out of the bias charges of the storage diodes in the light receiving area 13 and the coupling area 11 by use of the first and second bias charge injection/sweep-out means.

Since the gate electrodes of the transfer means formed adjacent to the first and second bias charge injection/sweep-out means are connected by the same wiring, the two bias charge injection/sweep-out means can be controlled by one clock, thus causing the structure to be easily realized.

The present invention is not limited to the above embodiment.

For example, it is not always necessary to connect the storage diodes of each line in the light receiving area 13 to the storage diodes of each line in the coupling area 11 in one-to-one correspondence. In this case, for example, the bias charge injection/sweep-out of the bias charge may be effected by use of one of the two bias charge injection/sweep-out means which is closer to the storage diode.

In addition, the present invention can be variously modified without departing the technical scope thereof.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A solid-state camera device comprising:

a semiconductor substrate;

a plurality of charge storage regions formed on said semiconductor substrate;

a charge controller including a timing pulse generator;

a charge transfer region formed on said semiconductor substrate and responsive to said charge controller for transferring a charge from said plurality of charge storage regions;

a bias charge injection diode formed on said semiconductor substrate and responsive to said charge controller for injecting a bias charge into said charge storage region;

sweeping out means for sweeping out at least part of a residual charge remaining in said charge transfer region after the charge controller causes the charge transfer region to transfer charge; and wherein the charge controller controls the sweeping means, the bias charge injecting diode, and the charge transfer region for resetting a reduced part of the bias charge into said charge storage region to emit the reduced part of the reset bias charge into said charge transfer region and further provides a timing pulse from the timing pulse generator for transfer of a signal charge to a signal output device.

2. The solid-state camera device according to claim 1, wherein said sweep means includes means for repeatedly effecting the operation of sweeping out the residual charge in said charge transfer region and the succeeding operation of resetting the bias charge in said charge storage region a predetermined number of times.

3. The solid-state camera device according to claim 1, further comprising a photo conversion layer stacked on a light receiving area on which said charge storage region and charge transfer region are arranged.

4. The solid-state camera device according to claim 1, wherein said plurality of charge storage regions are arranged in a matrix form.

5. The solid-state camera device according to claim 4, wherein said sweep means includes means for repeatedly effecting the operation of sweeping out the residual charge in said charge transfer region and the succeeding operation of resetting the bias charge in said charge storage region a predetermined number of times.

6. A solid-state camera device according to claim 4, further comprising a photo conversion layer stacked on a light receiving area on which said charge storage region and charge transfer region are arranged.

7. The solid-state camera device according to claim 4, wherein said charge transfer region has a plurality of charge transfer regions arranged along said plurality of charge storage regions.

8. The solid-state camera device according to claim 7, wherein said sweep means includes means for repeatedly effecting the operation of sweeping out the residual charge in said charge transfer region and the succeeding operation of resetting the bias charge in said charge storage region a predetermined number of times.

9. The solid-state camera device according to claim 7, further comprising a photo conversion layer stacked on a light receiving area on which said charge storage region and charge transfer region are arranged.

10. The solid-state camera device according to claim 4, in which said charge transfer region has a plurality of charge transfer regions arranged along said plurality of charge storage regions and wherein said signal output device comprises:

a vertical charge transfer region for transferring signal charges read from said charge storage region in a vertical direction;

a horizontal charge transfer region for transferring the signal charges from said vertical charge transfer region in a horizontal direction, and a signal charge detector for reading the signal charges transferred by said horizontal charge transfer region.

11. The solid-state camera device according to claim 10, wherein said sweep means includes means for repeatedly effecting the operation of sweeping out the residual charge in said charge transfer region and the succeeding operation of resetting the bias charge in said charge storage region a predetermined number of times.

12. The solid-state camera device according to claim 10, further comprising a photo conversion layer stacked on a light receiving area on which said charge storage region and charge transfer region are arranged.

13. The solid-state camera device according to claim 1, further comprising:

a light receiving area formed on said semiconductor substrate and having a plurality of photoelectric conversion sections for photoelectrically converting incident light;

a storage region for temporarily storing the charge transferred from said charge transfer region;

first bias charge injection/sweep-out means disposed adjacent to said light receiving area and in an area on the opposite side with respect to said storage region; and second bias charge injection/sweep-out means disposed in an area between said light receiving area and said storage region.

14. The solid-state camera device according to claim 13, wherein each of said first and second bias charge injection/sweep-out means includes a bias charge injection/sweep-out diode and a bias charge injection/sweep-out gate, the gate electrodes of said charge transfer region adjacent to said bias charge injection/sweep-out gates being connected to each other.

15. A solid-state camera device driving method comprising:

a first step of injecting a bias charge from a bias charge injection diode to a charge storage region via a transfer region;

a second step of sweeping at least part of a residual charge remaining in the charge transfer region after transfer of charge through the charge transfer region in response to a timing pulse generator providing timing pulses for transferring signal charge to a signal output;

a third step of resetting a reduced part of the bias charge and bringing the reduced part of the bias charge into the charge transfer region; and a fourth step of bringing a signal charge into the charge storage region for a preset period of time and subsequently reading the stored signal charge together with the reduced part of the bias charge.

16. The solid-state camera device driving method according to claim 15, further comprising a step of repeatedly effecting said second step and third step by a plural number of times.

* * * * *